United States Patent [19]

Sugita et al.

[11] Patent Number: 4,931,307
[45] Date of Patent: Jun. 5, 1990

[54] METHOD OF CORRECTING DEFECT OF PATTERNED ARTICLE

[75] Inventors: Toshio Sugita, Tachikawa; Hiroyuki Funamoto, Tokyo; Kazuyoshi Furuta, Tokyo; Osamu Koseki, Tokyo, all of Japan

[73] Assignees: Department of Electrical Engineering, Science University of Tokyo; Seiko Instruments, Inc., both of Japan

[21] Appl. No.: 416,879

[22] Filed: Oct. 4, 1989

[30] Foreign Application Priority Data

Oct. 5, 1988 [JP] Japan .................... 63-249780

[51] Int. Cl.⁵ .................... B05D 3/06
[52] U.S. Cl. .................... 427/38; 156/643; 427/261; 427/264; 427/294; 427/402; 427/444
[58] Field of Search ............ 427/38, 261, 264, 294, 427/402, 444; 156/643

*Primary Examiner*—Bernard Pianalto
*Attorney, Agent, or Firm*—Bruce L. Adams; Van C. Wilks

[57] ABSTRACT

A method of correcting a missing defect of a patterned film formed on an article is carried out by steps of providing an operative vacuum chamber having a pin hole, positioning an area of the missing defect outside the vacuum chamber in registration with the pin hole, operating the vacuum chamber to cause therein cold cathode discharging to generate particles, and directing a stream of the particles through the pin hole onto the area of the missing defect to deposit thereon a corrective film of the particles. A method of correcting a remaining defect of a patterned film formed on an article is carried out by steps of providing an operative vacuum chamber having a pin hole, positioning an area of the remaining defect outside the vacuum chamber in registration with the pin hole, operating the vacuum chamber to cause therein cold cathode discharging to generate particles and gas ions, and directing a stream of the particles and gas ions through the pin hole onto the area of the remaining defect to thereby remove therefrom a left patterned film to correct the remaining defect.

2 Claims, 5 Drawing Sheets

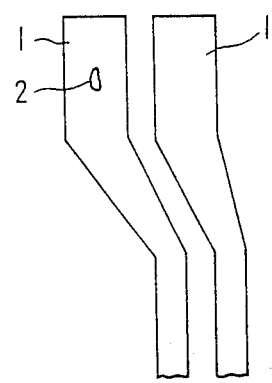
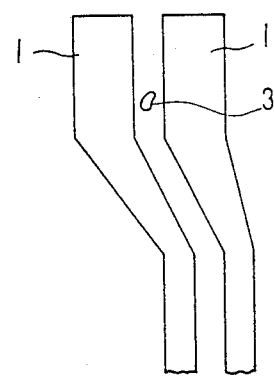
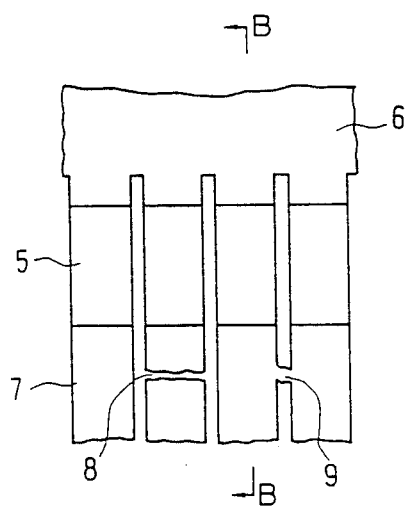
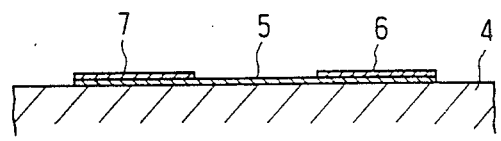

METHOD OF CORRECTING DEFECT OF PATTERNED ARTICLE

BACKGROUND OF THE INVENTION

The present invention relates to method of correcting defect of a pattern formed on an article substrate, such as a thermal head and a photomask which is used for forming fine patterns of a printed circuit board and a semiconductor device etc.

FIGS. 7 and 8 are a partial plan view of a surface of a photomask. FIG. 7 shows a missing or transparent detect 2 within a patterned Cr film 1 formed on a substrate. The missing defect 2 is defined as an incidentally lost part of the regular pattern and therefore is transparent on the photomask. FIG. 8 shows a remaining or oblique defect outside a regularly patterned Cr film 1 formed on the photomask substrate. The remaining defect 3 is defined as an incidentally left part of the film 1 other than the regular predetermined pattern.

FIG. 9 shows a partial plan view of a surface of a thermal head and FIG. 10 is a sectional view taken along line B—B of FIG. 9. The thermal head is comprised of a substrate 4 made of $A_2O_3$, a heat-generating resistive element 5 formed of TaN on the substrate 4 and patterned electrodes 6 and 7 made of Cu and connected to the heat-generating resistive element 5. Each segment of the electrodes 7 has a width of 0.105 mm, and adjacent segments have therebetween a spacing of 0.02 mm. A missing defect 8 is incidentally caused on the patterned electrode 7, and a remaining defect 9 is incidentally caused between adjacent patterned electrodes 7.

There have been various conventional methods of correcting missing defects of pattern caused on a patterned article such as photomasks and thermal head elements. For example, a photoresist film is coated over the entire surface of the patterned article and a part thereof is removed by exposure and developing processes from an area corresponding to the missing defect. Thereafter, metals such as Cr and Cu are evaporated over the article to selectively deposit a metal film on the area of missing defect 2 or 8. This correction method is called evaporation method. In another method, ion beam or laser beam is irradiated onto the portion of missing defect 2 or 8 within medium of organic metal complex gas or organic metal gas to form a corrective film on the portion of missing defect 2 or 8. This ion beam or laser beam method is disclosed, for example, in Japanese Patent Publication Nos. 46055/1983 and 22372/1984 and in Japanese laid-open Patent Application No. 182726/1985.

There have been various conventional methods of correcting remaining defects caused on the patterned article. For example, a photoresist is coated over the entire surface of the article, and a part thereof is selectively removed by exposure and developing processes from an area corresponding to the remaining defect 3 or 9. Thereafter, the exposed remaining defect is etched and eliminated. This method is called etching method. In another way, ion beam or laser beam is selectively irradiated onto the remaining or left defect 3 or 9 to remove the same. This method is called ion beam or laser beam method.

However, in the evaporation and etching methods, coating, exposure and developing processes of photoresist film are required to thereby consume considerable amount of working time. Further, these additional processes may cause another subsidiary pattern defect. In the ion beam method, a patterned article to be corrected must be held in vacuum. The ion beam has a small beam spot, hence the considerable amount of correction time is consumed to correct a pattern defect which may have a dimension in the order more than several tens $\mu$m. In addition, a correcting apparatus is expensive. In the laser beam method of correcting missing defects, the formed corrective film does not have sufficient adhesiveness to the substrate. Since utilized organic metal gas must be treated carefully, the correcting work is troublesome. The utilized correcting apparatus is expensive. Further, in the laser beam method of correcting remaining defects, the utilized correcting apparatus is expensive.

SUMMARY OF THE INVENTION

In view of the above noted various drawbacks of the prior art, an object of the present invention is to provide improved method of correcting missing defect of pattern, characterized in that correcting time can be shortened, additional or subsequent pattern defect may not be caused, a patterned article to be corrected is not required to stay in vacuum, used correcting apparatus is cheap, the formed corrective film has a sufficient adhesiveness, and correcting work can be easily carried out.

Another object of the present invention is to provide improved method of correcting remaining defects of pattern, characterized in that the correcting time can be shortened, additional pattern defects may not be caused, the patterned article may not be required to stay in vacuum, and a used correcting apparatus is cheap.

In order to realize the objects, according to one aspect of the present invention, a patterned article having a missing defect is placed outside a vacuum chamber which has an opening or pin hole. The missing defect portion is positioned in opposed relation to the opening of the vacuum chamber. Thereafter, particles are generated in the vacuum chamber by means of cold cathode discharging and are deposited on the missing defect portion.

According to another aspect of the present invention, a patterned article having a remaining defect is placed outside an operative vacuum chamber. The remaining defect portion is positioned in opposed relation to an opening or pin hole formed in the vacuum chamber. Thereafter, the vacuum chamber is operated to generate particles or gas ions by means of cold cathode discharging and to impinge the particles or gas ions onto the remaining defect portion to remove the same.

In the above described method of correcting missing defects of pattern, coating, exposure and developing processes of photoresist are not needed. A corrective film having a size corresponding to that of the opening can be formed by a single operation. Moreover, organic metal gas is not needed to form the corrective film.

In the above described method of correcting remaining or left defects of pattern, coating, exposure and developing processes of photoresist are not required. A remaining defect portion having a size corresponding to that of the opening can be removed by a single sequence of the operation.

BRIEF DESCRIPTION OF THE DRAWINGS

FIGS. 7 and 8 are a partial plan view of a surface of a photomask;

FIG. 9 is a partial plan view of a surface of a thermal head; and

FIG. 10 is a sectional view taken along line B—B of FIG. 9.

DETAILED DESCRIPTION OF THE INVENTION

Figure 1:
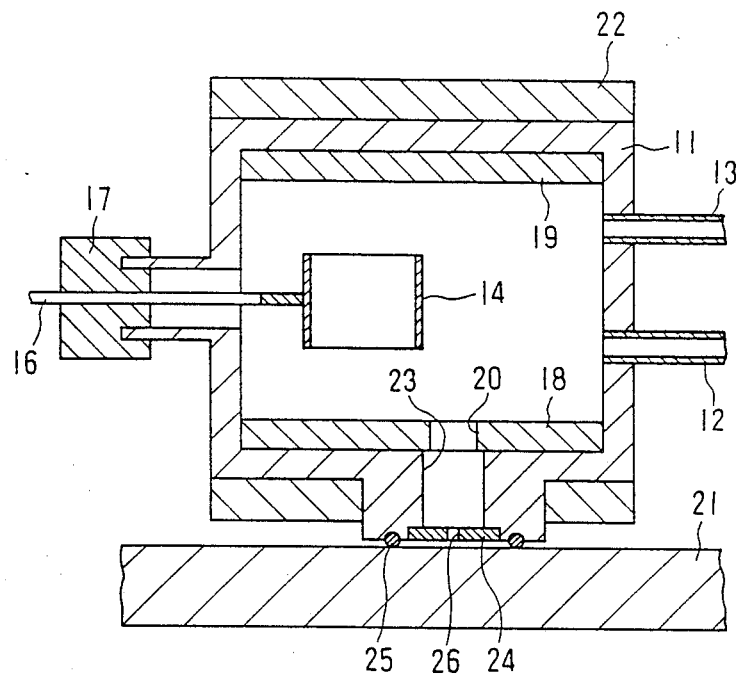
FIG. 1 is a schematic sectional view of a correcting apparatus for carrying out the method of correcting missing defects of patterned film according to the present invention.

FIG. 1 is a schematic sectional view showing a correcting apparatus for carrying out the method of correcting a missing defect of a patterned film according to the present invention. In the figure, the apparatus is comprised of a vacuum chamber 11 and an evacuating pipe 12 provided on the vacuum chamber 11 and connected to a vacuum evacuating device (not shown). A gas introducing pipe 13 is provided on the vacuum chamber 11 and connected to an inert gas supply device (not shown). A cylindrical anode 14 is provided within the vacuum chamber 11 and is made of SUS. An anode lead 16 is attached to the anode 14 and is connected to a direct current high voltage power source (not shown). An insulator 17 is provided to fix the anode lead 16 to the vacuum chamber 11. A pair of planer counter cathodes 18 and 19 are attached to the vacuum chamber 11 and are disposed both sides of the anode 14. The counter cathodes 18 and 19 are arranged perpendicular to the center line or cylindrical axis of the anode 14 and are held to the earth potential. The counter cathodes 18 and 19 are made of Cr. A throughhole 20 is formed in the counter cathode 18. A center line of the throughhole 20 passes or extends outside the cylindrical anode 14. An opening 23 is formed through a wall of the vacuum chamber 11 in registration with the throughhole 20. A plate member 24 is disposed to close the opening 23 and is formed with a pin hole 26. The pin hole 26 has a section diameter in the range from several μm to several mm. A stream of particles is irradiated through the pin hole 26 onto a substrate 21 within an area correspondingly substantially to the sectional shape of the pin hole 26. The center lines of the opening 23 and the pin hole 26 are aligned substantially with that of the throughhole 20. The section of the pin hole 26 may be shaped in circle or rectangle. A magnet 22 is attached outside the vacuum chamber 11 such that the direction of magnetic flux of the magnet 22 is arranged in parallel to the center line of the anode 14. The magnetic flux density of the magnet 22 is set to 0.1. The substrate 21 of a photomask to be corrected is disposed outside the vacuum chamber 11. A sealing 25 is disposed on an outer wall of the vacuum chamber 11 around the opening 23. The sealing 25 is compressed by the substrate 21 of the photomask against the outer wall of the chamber so as to seal the vacuum chamber 11.

In the method of correcting a missing defect of a pattern formed on the substrate according to the present invention, a missing defect 2 of the pattern is positioned in registration and correspondence to the pin hole 26. Then, the vacuum chamber 11 is evacuated by the vacuum evacuating device or vacuum pump at gas pressure of $1 \times 10^{-4}$ Pa, and Ar gas is introduced through the gas introducing pipe 13 from the inert gas supply device into the evacuated vacuum chamber 11 such that $2 \times 10^{-2}$ Pa of Ar gas is filled within the vacuum chamber 11. Then, positive voltage of 1.5 kV is applied to the anode 14 by means of the direct current high voltage power supply so as to cause cold cathode discharging between the anode 14 and the respective counter cathodes 18 and 19 to thereby generate positive ions of the introduced Ar gas. The Ar positive ions strike the surface of the counter cathodes 18 and 19 such that Cr atoms are sputtered away from the counter cathodes 18 and 19. A part of the sputtered Cr atoms pass through the throughhole 20, the opening 23 and the pin hole 26, and are deposited onto an area of the missing defect 2 to form thereon a Cr film to thereby correct the missing defect 2 of the photomask pattern.

As described above, according to the inventive method of correcting the missing defect of the pattern, prior coating, exposure and developing steps are not needed to thereby carry out the correction quickly. Moreover, new pattern defects may not be caused. Further, the photomask substrate 21 is not needed to stay in vacuum. Since a corrective film having a size corresponding to that of the pin hole 26 can be formed by a single sequence of the correcting operation, the correcting time of the missing defect can be considerable reduced. The correcting apparatus used in carrying out the defect correction has rather simple structure an therefore is cheap. In addition, by selecting the sectional shape of the pin hole 26, the correction can be easily carried out according to a shape of the defect area. The deposited corrective film has a sufficient adhesiveness to the substrate. Since the organic metal gas material is not used, the correcting work can be easily controlled.

When applying the positive voltage to the anode 14 for three minutes, the corrective film is formed on the missing defect area at the thickness of 0.1 mm. The optical density of this corrective film measured by an optical density measuring device is about 3.5 which is greater than that of Cr film of the normally produced photomask. Thus, the corrective Cr film formed on the missing defect area has a sufficient density of Cr atoms. The optical density is defined by $\log_{10} (I_0/I)$ where $I_0$ indicates intensity of the incident light and $I$ indicates intensity of light transmitted through the film. The corrective film formed on the missing defect area is rubbed strongly with an applicator wetted by alcohol more than fifty times, but the film formed on the area of the missing defect 2 is not pealed. Further, the substrate 21 of the corrected photomask is dipped in pure water and is applied with ultrasonic wave for three minutes, but the pealing of the film or the generation of a pin hole is not observed.

Figure 2:
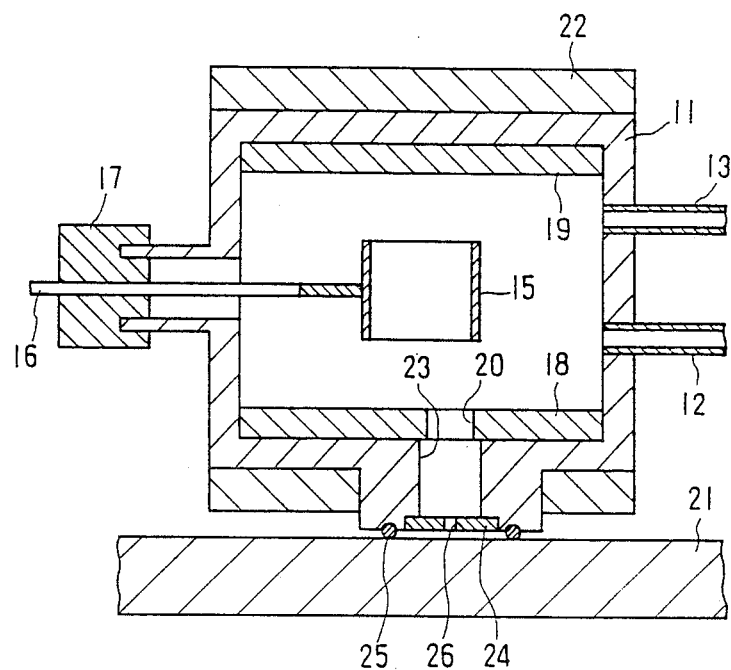
FIG. 2 is a schematic sectional view of a correcting apparatus for carrying out the method of correcting remaining defects of patterned film according to the present invention.

FIG. 2 is schematic sectional view of a correcting apparatus for carrying out the inventive method of correcting a remaining or left defect of pattern. In the figure, the apparatus is comprised of a cylindrical anode 15 attached to an anode lead 16 and made of SUS. A center line of a throughhole 20 formed in a counter cathode 18 passes and extends inside the cylindrical anode 15. Other constructions of the FIG. 2 apparatus is identical to those of the FIG. 1 apparatus.

In the method of correcting the remaining defect according to the present invention, the remaining or oblique defect portion of the pattern formed on the substrate 21 of the photomask is positioned in registration with a pin hole 26. Thereafter the vacuum chamber is evacuated by the vacuum evacuating device such that the vacuum chamber 11 is maintained at gas pressure of $1 \times 10^{-4}$ Pa. Then, Ar gas is introduced into the gas chamber 11 from the inert gas supply device so that the vacuum chamber 11 is filled with $2 \times 10^{-2}$ pa of Ar gas. When a positive voltage of 1.5 kV is applied to the anode 15 by the direct current high voltage power source, cold cathode discharging is induced between the anode 15 and the respective counter cathodes 18 and 19 to thereby generate positive ions of Ar gas. The positive ions strike the surface of the counter cathodes 18 and 19 so that Cr atoms are sputtered away from the counter cathodes 18 and 19. A part of the sputtered Cr atoms and the positive ions of Ar gas pass through the throughhole 20, the opening 23 and the pin hole 26 to strike and etch the left film of the remaining defect 3 to remove the left film to thereby correct the remaining defect.

As described above, according to the inventive method of correcting the remaining defect, since prior coating, exposure and developing steps of photoresist are not employed, the correction can be effected quickly and new pattern defects may not be caused. Further, the substrate 21 of the photomask is not needed to stay in the vacuum chamber. Since the defective left film of the size corresponding to the section size of the pin hole 26 can be removed by a single sequence of the correcting operation, a large dimension of the remaining defect 3 can be quickly corrected without consuming a great amount of working time. In addition, the apparatus used for carrying out the correction is rather cheap. When applying the positive voltage to the anode 15 for about 20 seconds, the left film of the remaining defect can be removed, and the corrected area has the optical density value of zero. Thus, the remaining defect 3 is completely eliminated.

Figure 3:
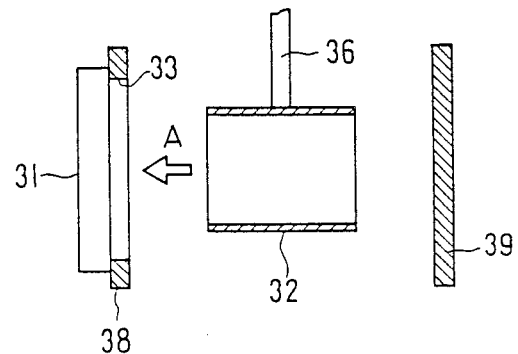
FIG. 3 is a sectional view of a part of an experimental correcting apparatus showing operation to correct pattern defects.
Figure 4:
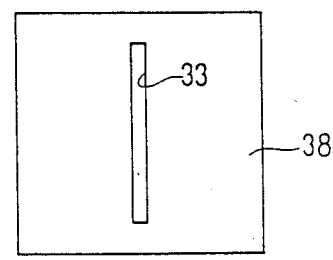
FIG. 4 is a plan view viewed from the direction A of FIG. 3.

FIG. 3 is a sectional view showing a part of an experimental apparatus used to demonstrate the operation of correcting pattern defects according to the present invention, and FIG. 4 is a plan view viewed from the direction of arrow A of FIG. 3. In the figures, the apparatus is comprised of an anode lead 36 provided in a vacuum chamber having a vacuum evacuating pipe and a gas introducing pipe, and a cylindrical anode 32 attached to the anode lead 36 and having 15 mm of the outer diameter and 14 mm of inner diameter. A pair of counter cathodes 38 and 39 are disposed both sides of the anode 32 and are made of gold. The planner counter cathodes 38 and 39 are disposed substantially perpendicular to the center line or cylindrical axis of the anode 32, and are held at the earth potential. The counter cathodes 38 and 39 have a dimension of $25 \times 25 \times 0.2$ mm. A slit 33 is formed in the counter cathode 38 and a substrate 31 is disposed in contact with the counter cathode 38. A permanent magnet (not shown) is provided to form a magnetic field substantially in parallel to the center line of the anode 32.

Figure 5:
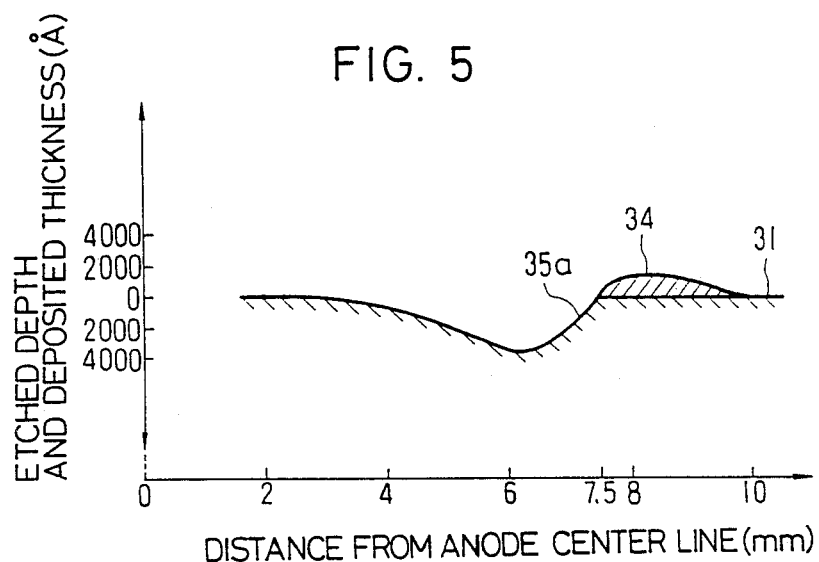
FIGS. 5 and 6 are a diagram showing a surface contour of a substrate treated by the experimental correcting apparatus of FIGS. 3 and 4.

FIG. 5 is a diagram showing an etched state of the surface of the substrate treated according to the experimental apparatus of FIGS. 3 and 4. The etched state is analyzed by a high sensitivity contact probe type surface analyzer. In the treatment, the substrate 31 made of glass is utilized. The vacuum chamber is evacuated to the gas pressure of $1 \times 10^{-4}$ pa, and then Ar gas is introduced into the vacuum chamber to fill the chamber with $2 \times 10^{-2}$ Pa of Ar gas. Thereafter, a positive voltage of 2 kV is applied to the anode 32 by means of a direct current high voltage power source. Sputtering of the cathodes is continuously carried out for 12 minutes with 5 mA of discharging current. Then, the surface analysis of the treated substrate is effected as shown in FIG. 5. FIG. 5 shows the relation between the distance from the center line of the anode 32 on the substrate surface and the thickness of gold film 34 deposited on the substrate 31 or etched depth of a cavity 35a formed in the substrate 31. As seen from the figure, the gold film 34 having about 2000 Å of thickness is formed on a part of the substrate located outside the projected circular boundary of the cylindrical anode 32, and the cavity 35a is formed just inside the boundary corresponding to the circular edge of the anode 32. The cavity 35a is formed deepest in the vicinity of the boundary, and its depth is about 4000 Å. As described, the cavity 35a is most deeply formed in the vicinity of the circular boundary inside thereof. The surface of the glass substrate 31 is stricken by the positive ions of Ar gas. Since the substrate 31 is made of non-metal material such as glass, the surface of the substrate is electrically charged when the positive ions of Ar gas continuously strike the surface of the substrate 31. After the electrical charging, the positive ions of Ar gas cannot strike the substrate surface. Further, neutral gold atoms having greater energy strike the substrate surface inside in the vicinity of the circular boundary corresponding to the circular edge of the anode to thereby etch intensively that area of the substrate surface. On the other hand, neutral gold atoms having smaller energy may be directed onto the substrate surface outside the circular boundary to thereby form the deposited film of gold. Accordingly, in the method of correcting a remaining defect of the pattern formed on the non-metal material, the center line of the throughhole 20 should be arranged to pass just inside the cylindrical periphery of the anode 15. Moreover, the boundary between the deposited gold film 34 and the etched cavity 35a is shifted by changing the applied electric and magnetic fields, and therefore, the position of the anode can be accordingly set.

Figure 6:
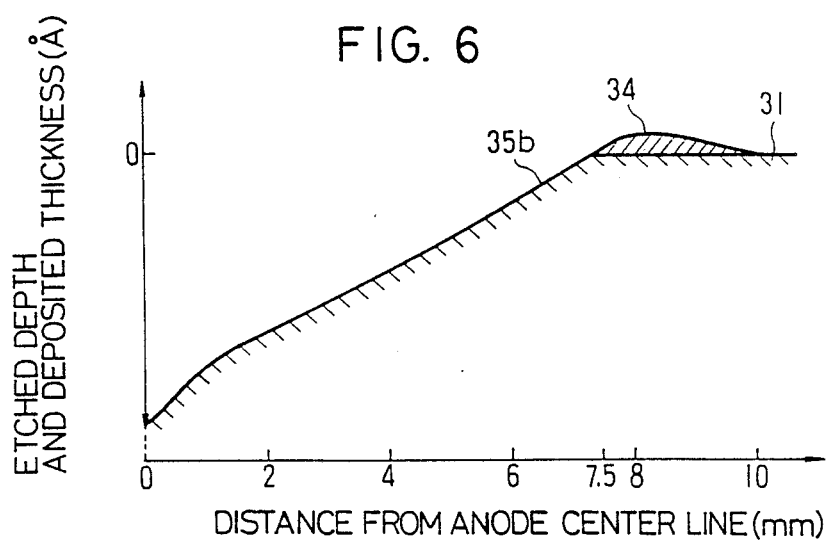

In similar manner, FIG. 6 is a diagram showing a surface contour of a substrate 31 made of metal treated by the FIGS. 3 and 4 experimental apparatus. FIG. 6 shows the distribution of thickness of the gold film 34 deposited on the substrate 31 and the etched depth of the cavity 35b formed concurrently in the same substrate 31 in terms of the distance from the center line of the cylindrical anode 32. As seen from the diagram, the gold film 34 is formed just outside the boundary corresponding to the circular edge of the anode 32, and the cavity 35b is formed inside the boundary of the cylindrical anode 32. The cavity 35b is formed deepest at the center of the circular boundary corresponding to the center of the anode 32. The reason may be explained as follows. Namely, the surface of the substrate 31 is stricken by the positive ions of Ar gas. Since the substrate is made of metal, the surface of the substrate 31 is not electrically charged even when applied continuously with the positive ions of At gas. Moreover, the positive ions of At gas have stronger energy along the radially inward direction of the anode toward the center line thereof. In addition, the surface of the substrate is stricken also by neutral gold atoms in the vicinity of the boundary corresponding to the circular edge of the anode 32. Moreover, in this area, the positive ions of At gas has higher energy than that of the neutral gold atoms. Accordingly, in the method of correcting the remaining or left defect of pattern formed on a metal substrate, the center line of the throughhole 20 should be aligned with that of the anode 15.

The above described embodiments are directed to the corrective treatment of the photomask. However, the present invention can be obviously applied to the corrective treatment of a thermal head of the patterned film type by selecting material of the counter cathode. The cylindrical anodes 14 and 15 are utilized in the above described embodiments. However, another configuration of the anode can be used, such as a rectangular tube anode, a tube anode having a notch in parallel to its center line, and a hollow anode comprised of two rings connected to each other by several rods. Further, in the above described embodiments, the vacuum chamber 11 is filled with Ar gas. However, the vacuum chamber may be filled with other inert gas. If the counter cathode is composed of inert material such as gold, the vacuum chamber can be filled with active gas. The anode lead 16 may be slideably attached to the vacuum chamber 11 through bellows, so that its position is selectively set relative to the throughhole 20, whereby the single correcting apparatus can be commonly used for correcting either of missing and remaining defects.

As described above, according to the inventive method of correcting the missing defect of pattern, since prior processes of coating, exposure and developing of photoresist are not required, the correction can be carried out within a short period of time and additional subsidiary defect may not be caused. A patterned article to be corrected is not needed to be held in vacuum. A corrective film having a size corresponding to the section of the pin hole can be formed by a single sequence of the operation. Therefore, a greater size of the missing defect can be quickly corrected. The correcting apparatus can be constructed at relatively low cost for carrying out the inventive correction method. Further, the formed corrective film has sufficient adhesiveness to the substrate. Moreover, organic metal gas is not utilized to thereby facilitate the correcting work.

Also, in the inventive method of correcting the left defect of pattern, since the preceding coating, exposure and developing steps of photoresist are not required in contrast to the conventional method, the correcting operation can be carried out at relatively short period and subsidiary pattern defect may be avoided. The patterned article to be corrected is not required to be held in vacuum. Since a left defect of the size corresponding to that of the pin hole can e removed by a single sequence of the correcting operation, the correction can be effected within a relatively short period of time even when the left defect has a relatively great dimension. Moreover, the correcting apparatus can be constructed at relatively low cost for carrying out the correction of the left defect. Thus, the present invention can achieve remarkable advantages as noted above.

What is claimed is:

1. A method of correcting a missing defect of a patterned film formed on an article, comprising the steps of:

providing an operative vacuum chamber having a pin hole;

positioning an area of the missing defect outside the vacuum chamber in registration with the pin hole;

operating the vacuum chamber to cause therein cold cathode discharging to generate particles; and directing a stream of the particles through the pin hole onto the area of the missing defect to deposit thereon a corrective film of the particles.

2. A method of correcting a remaining defect of a patterned film formed on an article, comprising the steps of:

providing an operative vacuum chamber having a pin hole;

positioning an area of the remaining defect outside the vacuum chamber in registration with the pin hole;

operating the vacuum chamber to cause therein cold cathode discharging to generate particles and gas ions; and directing a stream of the particles and gas ions through the pin hole onto the area of the remaining defect to thereby remove therefrom a left patterned film to correct the remaining defect.

* * * * *